(12) United States Patent
Cheng et al.

(10) Patent No.: US 7,345,874 B2
(45) Date of Patent: Mar. 18, 2008

(54) HEAT DISSIPATING DEVICE WITH DUST-COLLECTING MECHANISM

(75) Inventors: Chih-Wei Cheng, Taipei (TW); Chi-Wei Tien, Taipei (TW); Hui-Lian Chang, Taipei (TW)

(73) Assignee: Compal Electronics, Inc., Taipei (TW)

( * ) Notice: Subject to any disclaimer, the term of this patent is extended or adjusted under 35 U.S.C. 154(b) by 357 days.

(21) Appl. No.: 11/048,804

(22) Filed: Feb. 3, 2005

(65) Prior Publication Data

US 2006/0039113 A1    Feb. 23, 2006

(30) Foreign Application Priority Data

Aug. 19, 2004    (TW) .............................. 93213256 U

(51) Int. Cl.
*H05K 7/20* (2006.01)
*F28D 15/00* (2006.01)

(52) U.S. Cl. ................. 361/695; 165/104.33; 165/121; 361/700

(58) Field of Classification Search ...................... None
See application file for complete search history.

(56) References Cited

U.S. PATENT DOCUMENTS 6,754,077 B2 *    6/2004    Lo et al. ...................... 361/700
6,980,434 B2 *    12/2005   Ou Yang et al. ............ 361/695

FOREIGN PATENT DOCUMENTS

JP    2000-151167 A  *  5/2000

* cited by examiner

*Primary Examiner*—Gregory D Thompson
(74) *Attorney, Agent, or Firm*—Bacon & Thomas, PLLC

(57) ABSTRACT

A heat dissipating device comprises a dust-collecting mechanism installed at the air vent passage of a fan, and thus the dust or particles mixed in the airflow of the fan shall be collected on the top of the dust-collecting mechanism; the dust-collecting mechanism can be taken out frequently to remove and clean the collected dust or particles, so that the airflow of the fan can be kept normal and the dust deposited on the surface of the metal fins of a heat sink can be decreased greatly as to normally maximize the heat dissipating efficiency for the heat dissipating device for a long period of time and maintain the heat generating source to operate normally at a permissible temperature.

11 Claims, 4 Drawing Sheets

HEAT DISSIPATING DEVICE WITH DUST-COLLECTING MECHANISM

BACKGROUND OF THE PRESENT INVENTION

1. Field of the Present Invention

The present invention relates to a heat dissipating device with a dust-collecting mechanism, more particularly to a heat dissipating device comprising a detachable dust-collecting mechanism installed at the air vent passage of a fan.

2. Description of Prior Act

To solve the heat dissipation problem caused by a heat generating source such as a central processing unit (CPU), a chipset and the like in computers, particularly portable computers, and to maintain the heat generating source to operate normally at a permissible temperature, an appropriate heat dissipating device is installed to dissipate the heat generated from the heat generating source.

In general, a traditional heat dissipating device comprises a heat sink and a fan, wherein the prior heat dissipating heat sink is used to lower the temperature of the heat generating source, and many metal fins are built to increase the heat dissipating surface area and improve the heat dissipating effect. Therefore, the heat sink being installed at the air vent passage of a fan can force to dissipate the heat from the heat sink and lower the temperature of the heat generating source by the airflow produced by the fan.

However, the dust in the air frequently deposits on the air vent passage of the fan after the traditional heat dissipating device has been used for a while, and thus the airflow of the fan will be decreased because the air vent passage of the fan is blocked by the dust. Further, dust also covers the surface of the metal fins of the heat sink and thus causing a low heat dissipation rate to the heat sink and this affects the heat dissipating effect of the heat generating source.

To overcome the shortcoming of the prior heat sink that dust will deposit at the air vent passage of the fan, some heat dissipating devices install a dustproof device at the air inlet to filter the dust in the air and reduce the dust entering into the fan and prevent dust from depositing at the air vent passage of the fan in order to normally maximize the heat dissipating effect of the heat dissipating device for a long period of time.

However, the result of installing a dustproof device at the air inlet of the foregoing prior heat dissipating device cannot completely prevent the particles in the air from entering into the interior of the fan. After the fan has been used for some time, the particles in the air still will deposit at the air vent passage of the fan and cause a poor heat dissipating effect to the heat generating source.

SUMMARY OF THE PRESENT INVENTION

Therefore, the primary objective of the present invention is to provide a heat dissipating device with a dust-collecting mechanism, which installs a detachable dust-collecting mechanism at the air vent passage of a fan, such that the dust or particles in the airflow produced by the fan will be collected on the dust-collecting fins and filter of the dust-collecting mechanism to reduce dust deposited on the surface of the metal fins of the heat sink and normally maximize the heat dissipating effect of the heat sink of the heat dissipating device.

The secondary objective of the present invention is to provide a heat dissipating device with a dust-collecting mechanism, which installs a detachable dust-collecting mechanism at the air vent passage of a fan, and the dust-collecting mechanism can be taken out frequently for removing and cleaning the collected dust or particles. Therefore, the air vent passage of the fan of the heat dissipating device can be kept unobstructed all the time and the airflow at the air vent can be maintained constant all the time so as to maximize the heat dissipating effect of the heat sink of the heat dissipating device all the time.

Another objective of the present invention is to provide a heat dissipating device with a dust-collecting mechanism, which installs a detachable dust-collecting mechanism at the air vent passage of a fan, and each dust-collecting fin of the detachable dust-collecting mechanism is disposed precisely between two adjacent metal fins of the heat sink such that the dust-collecting mechanism maintains it heating dissipating effect, in addition to normally maximizing the dust-collecting effect.

BRIEF DESCRIPTION OF THE DRAWING FIGURES

DETAILED DESCRITION OF THE PREFERRED EMBODIMENTS

Figure 1:
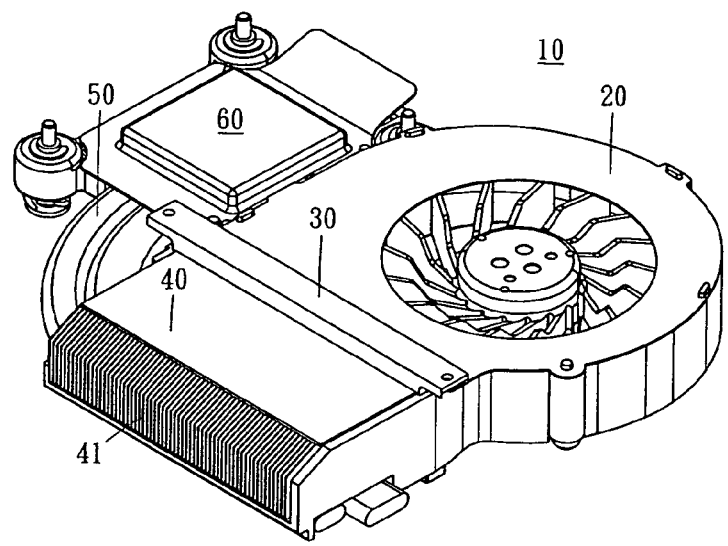
FIG. 1 is a perspective view of the heat dissipating device of the present invention.
Figure 2:
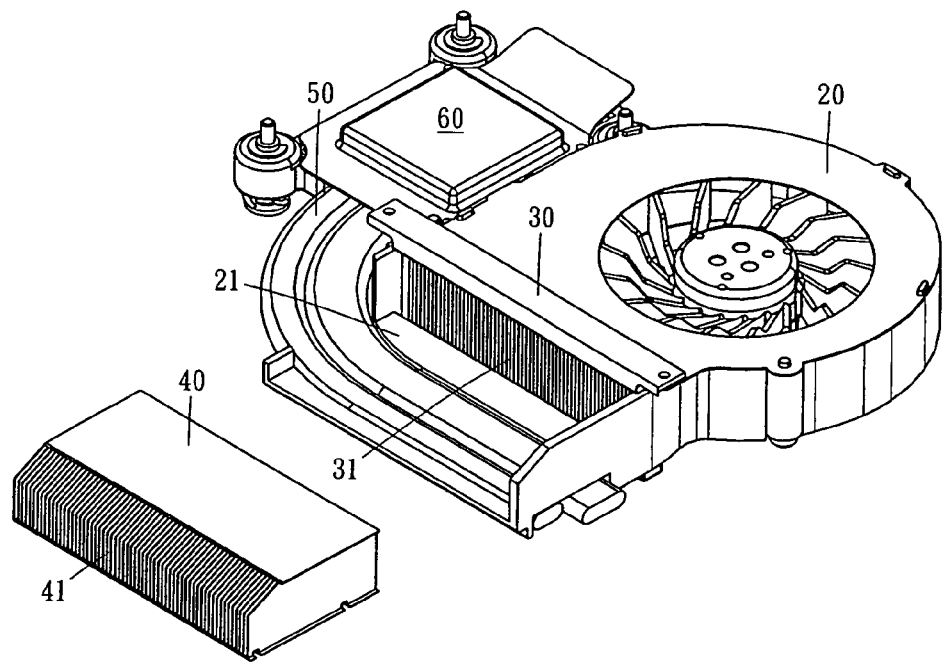
FIG. 2 is a view of the use of a dust-collecting installed at the air vent passage of the heat dissipating device according to the present invention.
Figure 3:
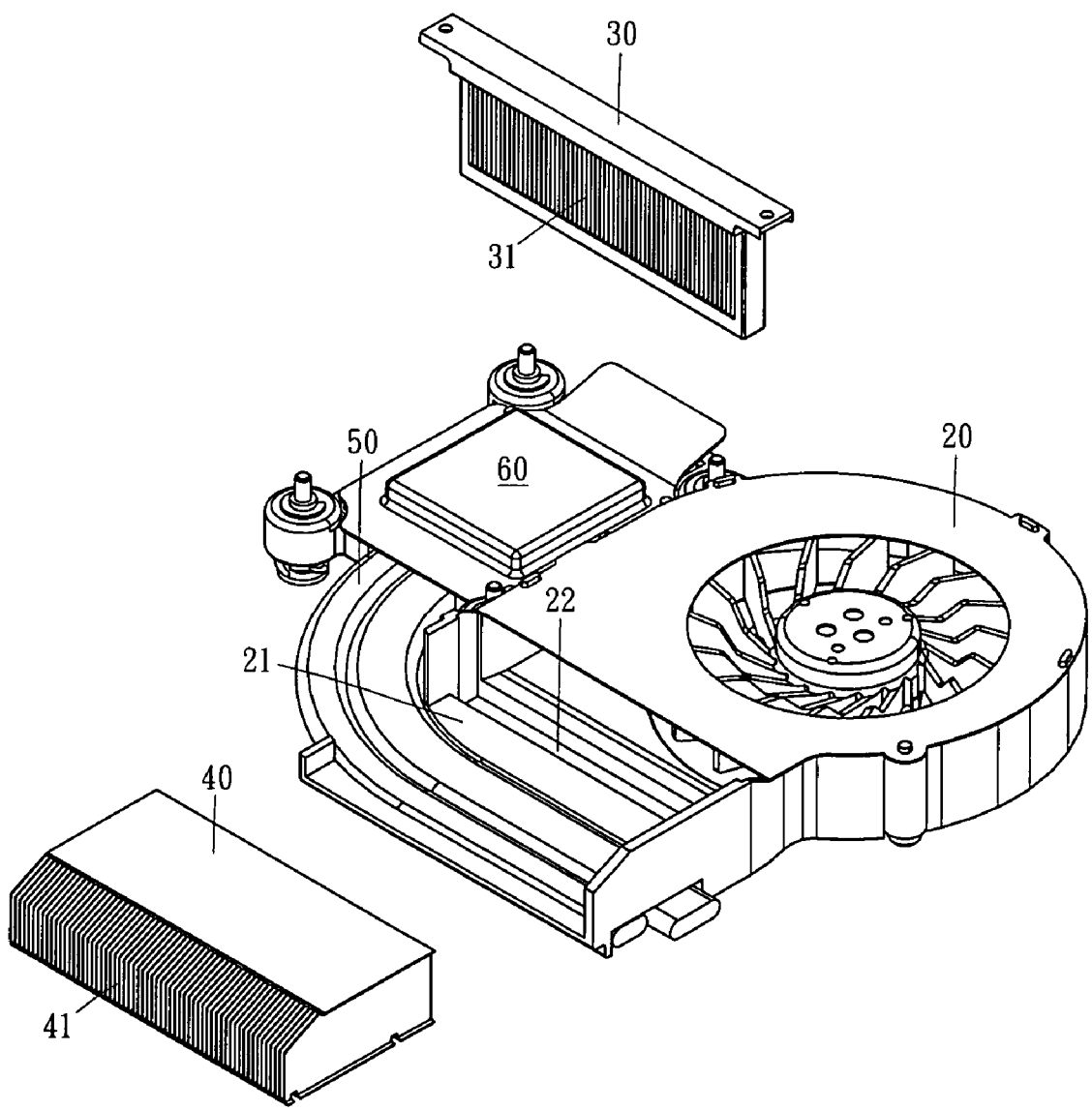
FIG. 3 is an exploded view of the heat dissipating device as depicted in FIG. 1.

The heat dissipating device disclosed by the present invention installs a detachable dust-collecting mechanism at the air vent passage of a fan. There are two embodiments with different structures. The heat dissipating device 10 according to the first preferred embodiment as shown in FIGS. 1 to 3 comprises a fan 20, a dust-collecting mechanism 30, a heat sink 40 and a heat pipe 50; wherein one end of the heat pipe 50 is connected to the heat sink 40 and the other end of the heat pipe 50 is used to conduct the heat produced by a heat generating source 60. Therefore, the heat sink 40 and the heat pipe 50 can be used to lower the temperature of the heat generating source 60. The heat generating source 60 could be a central processing unit (CPU) or a chipset.

The structure of the heat dissipating device 10 according to the second preferred embodiment does not include the heat pipe 50 and comprises a fan 20, a dust-collecting mechanism 30 and a heat sink 40. The heat sink 40 is used directly for conducting the heat produced by the heat generating source 60 to lower the temperature of the heat generating source 60. The heat generating source 60 could be a central processing unit (CPU) or a chipset.

As shown in FIG. 3 for a heat dissipating device 10 according to the present invention, the heat dissipating device 10 is installed at the air vent passage 21 of the fan 20 and a slot 22 is disposed proximate to the air outlet of the fan 20 for receiving the insertion of the lower end of the dust-collecting mechanism 30.

Referring to FIGS. 1 to 3 for the dust-collecting mechanism 30 which comprises a plurality of parallel dust-collecting fins 31, and the dust-collecting fin 31 can install a filter (not shown in the figure) to improve the dust-collecting effect. Particularly, each dust-collecting fin 31 can be installed at a position between two adjacent metal fins 41 of the heat sink 40 according to the requirements of the product or parallel to any of the corresponding metal fins 41 and linear with the metal fins, such that the dust-collecting mechanism 30 can maintain the heat dissipating effect of the heat sink 40 in addition to maximizing the dust-collecting effect.

After the dust-collecting mechanism 30 is inserted into the slot 22 disposed at the air vent passage 21 of the fan 20, the dust-collecting mechanism 30 is fixed onto the air vent passage 21 of the fan 20. Then, the dust-collecting fins 31 and the filter of the dust-collecting mechanism 30 precisely block the air vent of the fan 20.

Therefore, after the airflow produced by the fan 20 passes through the dust-collecting fins 31 and the filter of the dust-collecting mechanism 30, the attached dust or particles will be centralized on the dust-collecting fins 31 and the filter of the dust-collecting mechanism 30, thus greatly reducing the dust or particles deposited on the surface of the metal fins 41 of the heat sink 40 as to normally maximize the heat dissipating effect of the heat sink 40 of the heat dissipating device 10 and maintain the heat generating source 60 to operate at a permissible temperature.

After the dust-collecting mechanism 30 has been used for some time, it can be taken out for cleaning. When the dust or particles on the dust-collecting mechanism 30 are removed or cleaned, the dust-collecting mechanism 30 can be inserted back to the air vent passage 21 of the fan 20 for further use. Therefore, the heat dissipating device 10 according to the present invention can maintain the air vent passage 21 of the fan 20 unobstructed, and keep the normal airflow produced by the fan 20 to maximize the normal heat dissipating effect of the heat sink 40 of the heat dissipating device 10 for a long period of time.

Figure 4:
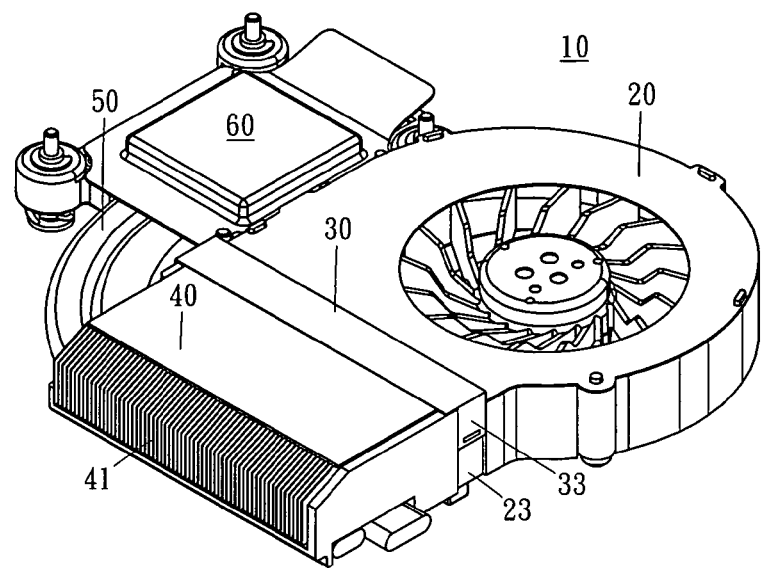
FIG. 4 is a perspective view of the heat dissipating device according to another preferred embodiment of the present invention.
Figure 5:
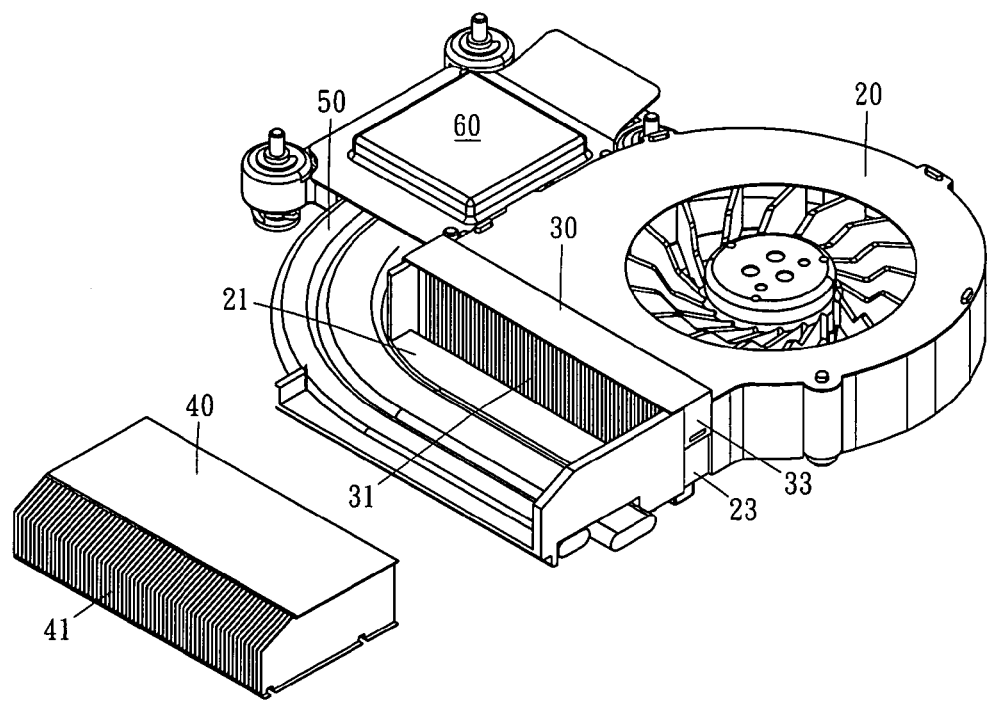
FIG. 5 is a view of the use of a dust-collecting installed at the air vent passage of the heat dissipating device according to another preferred embodiment of the present invention.
Figure 6:
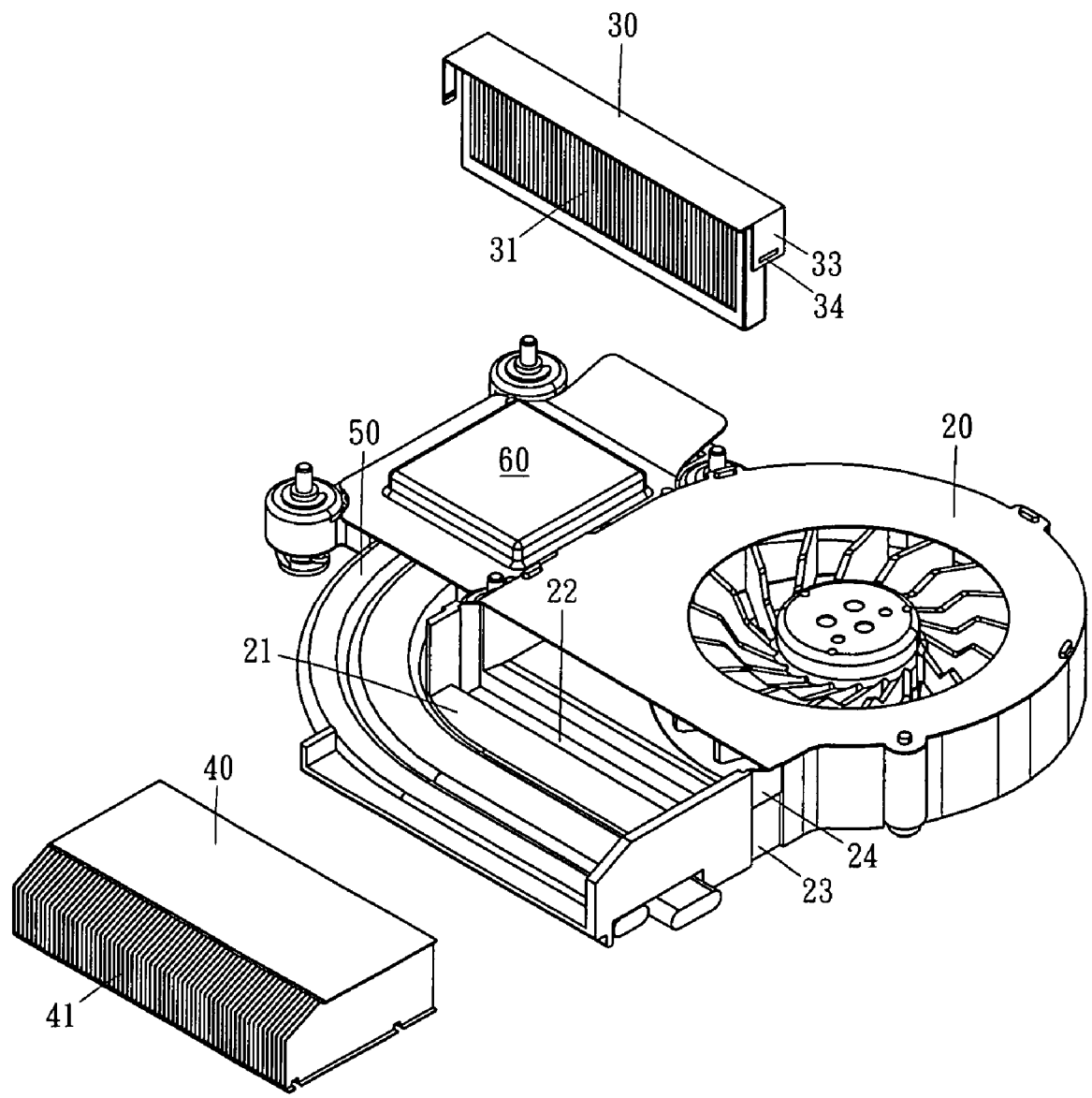
FIG. 6 is an exploded view of the heat dissipating device as depicted in FIG. 4.

Further, as shown in FIGS. 4 to 6 for the dust-collecting mechanism 30 according to another preferred embodiment of the present invention, the dust-collecting mechanism 30 comprises a latch bracket 33 disposed separately on both sides of the top of the dust-collecting mechanism; a tenon 34 protruded towards the internal side on the surface of the latch bracket 33; a latch groove 23 with a tenon groove 24 disposed on the external side of the body of the fan 20 at a position corresponding to the installation of the latch bracket 33 of the dust-collecting mechanism 30, such that after the dust-collecting mechanism 30 uses the tenon 34 of the latch bracket 33 to latch the tenon groove 24 of the fan 20, the dust-collecting mechanism 30 is fixed onto the air vent passage 21 of the fan 20 and the dust-collecting fins 31 and the filter net of the dust-collecting mechanism 30 precisely block the air vent of the fan 20.

If it is necessary to remove the dust-collecting mechanism 30 for cleaning, the latch bracket 33 of the dust-collecting mechanism 30 is turned slightly outward to separate the tenon 34 of the latch bracket 32 from the tenon groove 24 of the latch groove 23 as to take out the dust-collecting mechanism 30 of the fan 20 easily. After the dusts or particles collected by the dust-collecting mechanism 30 are removed or cleaned, the tenon 33 of the latch bracket 32 of the dust-collecting mechanism 30 latches the tenon groove 24 of the latch groove 23 of the fan 20 to fix the dust-collecting mechanism 30 onto the air vent passage 21 of the fan again.

Further, the dust-collecting mechanism 30 of the invention further comprises a handle (not shown in the figure) for providing an easy way for users to take the dust-collecting mechanism 30 out from the air vent of the fan 20.

There are many ways of fixing the dust-collecting mechanism 30 at the air vent of the fan 20. The description of the foregoing embodiment only gives a way of fixing the dust-collecting mechanism 30 to the air vent of the fan 20. Other ways include using screws to fix the dust-collecting mechanism 30 or using hooks to fix the dust-collecting mechanism 30, but these ways of fixing the dust-collecting mechanism 30 do not limit the scope of this invention.

What is claimed is:

1. A heat dissipating device with a dust-collecting mechanism, comprising a fan and a heat sink installed at an air vent passage of said fan; wherein said passage at the air vent of said fan provides a slot in which the lower end of said dust-collecting mechanism is inserted therein.

2. The heat dissipating device with a dust-collecting mechanism of claim 1, wherein said dust-collecting mechanism comprises a latch bracket disposed separately on both sides of the top surface of said dust-collecting mechanism, and said latch bracket comprises a tenon disposed on a surface of said latch bracket, and said fan has a tenon groove disposed on each external side of the fan body to allow the latching to occur.

3. The heat dissipating device with a dust-collecting mechanism of claim 1, wherein said dust-collecting mechanism comprises a plurality of parallel dust-collecting fins.

4. The heat dissipating device with a dust-collecting mechanism of claim 3, wherein said each dust-collecting fin of said dust-collecting mechanism is disposed between two adjacent metal fins of said heat sink.

5. The heat dissipating device with a dust-collecting mechanism of claim 3, wherein said each dust-collecting fin of said dust-collecting mechanism is disposed parallel to any one of said corresponding metal fins and linear with said corresponding metal fins.

6. A heat dissipating device with a dust-collecting mechanism, comprising a fan, a heat sink installed at an air vent passage of said fan, and a heat pipe which one end is coupled to said heat sink and the other end is coupled to a heat generating source for conducting the heat produced by said heat generating source, wherein the dust-collecting mechanism is installed at the air vent of said fan.

7. The heat dissipating device with a dust-collecting mechanism of claim 6, wherein said passage at the air vent of said fan provides a slot in which the lower end of said dust-collecting mechanism is inserted therein.

8. The heat dissipating device with a dust-collecting mechanism of claim 6, wherein said dust-collecting mechanism comprises a latch bracket disposed separately on both sides of the top surface of said dust-collecting mechanism, and said latch bracket comprises a tenon disposed on a surface of said latch bracket, and said fan has a tenon groove disposed on each external side of the fan body to allow the latching to occur.

9. The heat dissipating device with a dust-collecting mechanism of claim 6, wherein said dust-collecting mechanism comprises a plurality of parallel dust-collecting fins.

10. The heat dissipating device with a dust-collecting mechanism of claim 9, wherein said each dust-collecting fin of said dust-collecting mechanism is disposed between two adjacent metal fins of said heat sink.

11. The heat dissipating device with a dust-collecting mechanism of claim 9, wherein said each dust-collecting fin of said dust-collecting mechanism is disposed parallel to any one of said corresponding metal fins and linear with said corresponding metal fins.

* * * * *